United States Patent [19]

Katakura

[11] Patent Number: 4,629,995
[45] Date of Patent: Dec. 16, 1986

[54] VARIABLE EMPHASIS CIRCUIT

[75] Inventor: Masayuki Katakura, Kanagawa, Japan

[73] Assignee: Sony Corporation, Tokyo, Japan

[21] Appl. No.: 782,974

[22] Filed: Oct. 2, 1985

[30] Foreign Application Priority Data

Oct. 19, 1984 [JP] Japan ................... 59-218238

[51] Int. Cl.⁴ .............................. H03F 1/26
[52] U.S. Cl. ..................... 330/149; 330/151; 330/305; 330/306; 333/14
[58] Field of Search .......... 330/149, 151, 304, 305, 330/307; 307/542; 333/14, 28 R; 381/94; 455/72

[56] References Cited

U.S. PATENT DOCUMENTS 4,055,818 10/1977 Gay .................. 330/151 X

Primary Examiner—James B. Mullins
Attorney, Agent, or Firm—Lewis H. Eslinger; Alvin Sinderbrand

[57] ABSTRACT

A variable emphasis circuit comprises an operational amplifier for receiving an input signal, a modified integrator for receiving a first signal provided from the operational amplifier, and a dividing circuit for dividing the first signal to k times and 1−k times according to a control voltage. The 1−k times the first signal and a second signal provided from the modified integrator are fed back to the operational amplifier, and an output signal is formed from the second signal and the k times the first signal.

6 Claims, 10 Drawing Figures

VARIABLE EMPHASIS CIRCUIT

BACKGROUND OF THE INVENTION

1. Field of the Invention:

This invention relates to a variable emphasis circuit suitable for a noise reduction apparatus for improving the signal to noise ratio.

2. Description of the Prior Art:

A noise reduction apparatus is usually used in various signal processing circuits for the purpose of improving the signal-to-noise ratio, and it is particularly important for sound multiplexing in the FM broadcasting or television broadcasting.

FIG. 5 shows the frequency spectrum of the TV sound multiplex system in U.S.A. As the baseband signal a sum L+R of signals, which is a first sound signal of stereo, is transmitted. The difference combination L−R of signals, which is a second sound signal of stereo, is transmitted as an amplitude modulation of a carrier $2f_H$ ($f_H$ being the horizontal scanning frequency).

As a third sound signal, a frequency modulation of a carrier at $5f_H$ is transmitted.

In the case of such sound multiplexing, the signal-to-noise ratio of the difference combination L−R of signals and the frequency modulation as the third sound signal is deteriorated particularly in a weak electric field range. Therefore, it is necessary to provide a noise reduction apparatus for these signals.

FIG. 6 is a block diagram showing such a noise reduction apparatus. Reference numeral 10 designates a compression system for compressing the dynamic range of the sound signals to be transmitted, and numeral 20 an expansion system for expanding the received signal to recover the original sound signals. A sound signal supplied to an input terminal 1 is first fed to a fixed emphasis circuit 2, which provides a preemphasis to a high frequency range where the noise component is high. The output of the fixed emphasis circuit 2 is fed to a voltage controlled variable gain amplifier 3 (hereinafter referred as VCA). Reference numerals 4 and 5 designate an effective value detector and a band-pass filter, respectively, for controlling the gain of the VCA 3. When the dynamic range of signal is large, the VCA 3 is controlled for compression. Reference numeral 6 designates a variable emphasis circuit for controlling only high frequency range gain to be described later, numerals 7 and 8 an effective value detector and a band-pass filter in the high frequency range, respectively, for generating a signal for controlling the variable emphasis circuit 6, and numeral 9 an output terminal.

The expansion system 20 on the receiving side likewise includes an input terminal 11, a variable emphasis circuit 12, a band-pass filter 13, an effective value detector 14, a VCA 15, a band-pass filter 16, an effective value detector 17, a fixed emphasis circuit 18 and an output terminal 19.

In such a noise reduction apparatus, the signal with preemphasis provided in the compression system 10 is subjected to a deemphasis process in the receiving side expansion system 20 for the improvement of the signal-to-noise ratio as is well known in the art. To this end, the band-pass filters 5 and 8 and effective value detectors 4 and 7 in the compression system and the band-pass filters 13 and 16 and effective value detectors 14 and 17 in the expansion system must have identical characteristics. Also, the VCA 3 and variable emphasis circuit 6 in the compression system must have opposite transfer characteristics to those of the VCA 15 and variable emphasis circuit 12 in the expansion system.

In this noise reduction apparatus, the variable emphasis circuit 6 in the compression system provides a greater emphasis to the high frequency range when the signal level is lower while it attenuates the high frequency range when the signal level is higher. Thus, when the input signal level is low the noise in the high frequency range can be suppressed, while when the input signal level is high, saturation in the high frequency range can be avoided. The noise suppression effect thus can be increased compared to a noise reduction system of the sole gain control type.

FIG. 7 shows the principles of the prior art variable emphasis circuit 6 (or 12). Reference numeral 21 designates an input terminal, numeral 22 a first weighting circuit to provide an emphasis to a high frequency component, and numerals 23 and 26 adders.

Reference numeral 24 designates a VCA, the gain A of which is controlled according to a signal from a control terminal 25. Reference numeral 27 designates a second weighting circuit having an opposite transfer characteristic to that of the first weighting circuit 22.

Reference numeral 28 designates an output terminal.

In this circuit, the transfer function H(s) between the input and output with respect to the gain A of the VCA 24 is given as $$H(s) = \frac{1 + A \cdot T(s)}{A + T(s)} \qquad (1)$$

where T(s) is the transfer characteristic of the first weighting circuit 22 and 1/T(s) is the transfer characteristic of the second weighting circuit 27.

Denoting the transfer function T(s) as $$T(s) = \frac{1 + S/\omega_o}{1 + S/\omega_p}$$

H(s) is expressed as $$H(s) = \frac{1 + \frac{S}{\omega_0}\left(\frac{1 + A\omega_0/\omega_P}{1 + A}\right)}{1 + \frac{S}{\omega_0}\left(\frac{A + \omega_0/\omega_P}{1 + A}\right)} \qquad (2)$$

in case of a high frequency emphasis characteristic where the DC constitutes the unit gain.

More specifically, when A=1, $$H(s) = 1.$$

When A=0, $$H(s) = \frac{1 + S/\omega_o}{1 + S/\omega_p} = T(s)$$

When A=∞, $$H(s) = \frac{1 + S/\omega_p}{1 + S/\omega_o} = \frac{1}{T(s)}$$

Thus, a variable emphasis circuit is constituted, in which the frequency characteristics vary with the gain A of the VCA 24 as shown in FIG. 8.

The gain A can be varied according to the control voltage (Vc), and the opposite transfer function $H(s)^{-1}$ can be obtained when the gain is 1/A.

FIG. 9 shows an example of such variable emphasis circuit which is formed in an integrated circuit. Reference numeral 31 designates a substrate of the integrated circuit, and numeral 32 a VCA of current input and current output which is formed in the substrate 31. Reference numeral 33 designates an operational amplifier, numeral 34 a variable emphasis input terminal, and numeral 35 an output terminal.

SUMMARY OF THE INVENTION

The scattered resistance of the integrated circuit generally has inferior absolute value accuracy and has high temperature dependency. Therefore, it is not suitable to implement an accurate time constant circuit or the like as an IC circuit.

Accordingly, the first and second weighting circuits 22 and 27 shown in FIG. 7 are constituted by externally provided resistors $R_1$, $R_2$, $R_3$ and $R_4$ and capacitors $C_1$ and $C_2$, and their inputs and outputs are connected together like loops through resistors $R_5$ and $R_6$, thus forming the variable emphasis circuit 6 (or 12).

Therefore, the circuit has a large number of connection pins P1 to P4 for connection to external parts or components, leading to increase of the size and cost of the circuit. The merits of the IC circuit implementation, therefore, can not be obtained.

The present invention has been intended in order to solve the above problems, and it seeks to provide a variable emphasis circuit, in which two weighting circuits are realized as a single integrating circuit to reduce external connection pins and external connection components and increase the accuracy.

According to the present invention, a variable emphasis circuit comprises an operational amplifier, to which an input signal is supplied, a modified integrator for providing an integral output including zero to make constant the high frequency range gain, and a dividing circuit for providing K and (1−K) times the output signal of the operational amplifier, and the output of the modified integrator and (1−K) times of the operational amplifier output are fed back to the input side of the operational amplifier. The output signal is formed according to K times the operational amplifier output and the output of the modified integrator.

With this variable emphasis circuit a continuously varying characteristics from the high frequency range attenuation characteristic to the high frequency range emphasis characteristic can be obtained through control of the control voltage supplied to the dividing circuit according to the effective value of the high frequency range and control of K in a range of 0 to 1.

The modified integrator has reduced number of time constant setting elements, and also the external components and external connection pins are reduced in number. Thus, the IC implementation can be facilitated, and the accuracy can be increased.

The above-mentioned and other objects and features of the invention will become apparent from the following detailed description taken in conjunction with the drawings which indicate embodiments of the invention.

DETAILED DESCRIPTION OF PREFERRED EMBODIEMNTS

Figure 1:
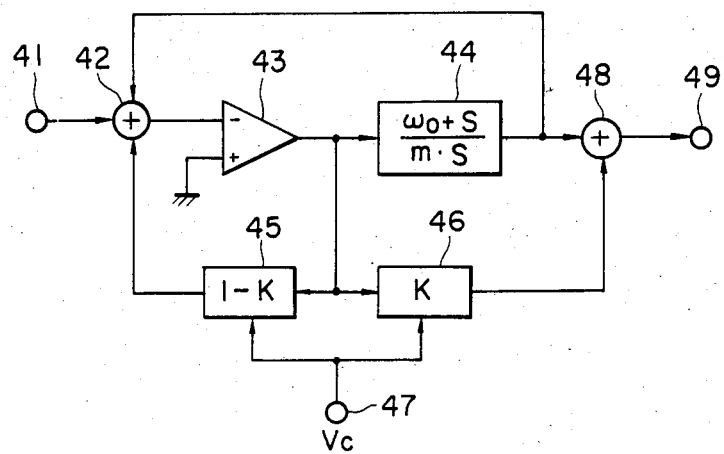
FIG. 1 is a schematic representation of the principles underlying a variable emphasis circuit according to the present invention.

FIG. 1 is a block diagram showing a variable emphasis circuit according to the present invention. Reference numeral 41 designates an input terminal, numeral 42 an input adder, 43 an operational amplifier, 44 a modified integrator with zero provided to provide a constant high frequency range gain, numerals 45 and 46 dividing circuits controlled according to a control voltage at a control terminal 47 such that their gains (current gains) are respectively 1−K times and K, numeral 48 an output adder, and numeral 49 an output terminal.

In this circuit, with the transfer function T(s) of the modified integrator 44 set to $$\frac{\omega_0 + S}{m \cdot S}$$

the transfer function H'(s) between the input and output is $$H'(s) = \frac{1 + \frac{S}{\omega_0}[1 + m \cdot K]}{1 + \frac{S}{\omega_0}[1 + m(1 - K)]} \tag{3}$$

Figure 7:
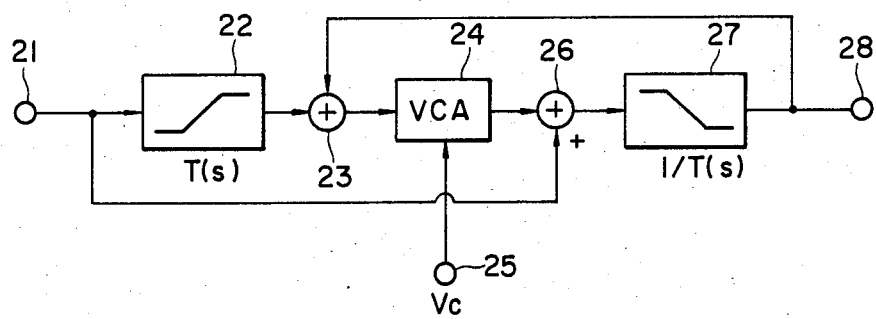
FIG. 7 is a schematic representation of a prior art variable emphasis circuit.

This transfer function H'(s) has an equivalent characteristic to the transfer function H(s) (equation (2)) in the case of FIG. 7 when the following conditions are met.

By setting the distribution coefficient K of the dividing circuits 45 and 46 to be in a range of 0 to 1 and setting $$K = \frac{A}{1+A} \text{ and } 1 - K = \frac{1}{1+A} \tag{4}$$

the equation (3) can be transformed to $$H'(s) = \frac{1 + \frac{S}{\omega_0}\left[\frac{1 + A(1+m)}{1+A}\right]}{1 + \frac{S}{\omega_0}\left[\frac{A + (1+m)}{1+A}\right]} \tag{5}$$

Comparing the equation (5) to the equation (2), it will be seen that the transfer functions H(s) and H'(s) may be made equal to obtain characteristics identical to those of the prior art variable emphasis circuit 6 (12) by:

(1) Setting the zero angular frequency $\omega_O$ of the transfer function T(s) in the weighting circuit 22 (27) in FIG. 7 to be equal to the zero angular frequency $\omega_O$ of the modified integrator 44.

(2) setting the ratio $\omega_O/\omega_P$ of the transfer function T(s) to be equal to 1+m, and (3) maintaining the relation $K=A/1+A$.

The individual components according to the present invention will now be described.

Figure 2:
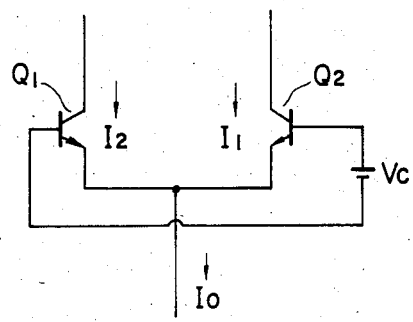
FIG. 2 is a circuit diagram showing a current dividing circuit.

The dividing circuits 45 and 46 can be realized as a transistor circuit as shown in FIG. 2.

It is known that the collector currents $I_1$ and $I_2$ in common emitter transistors $Q_1$ and $Q_2$ are given as $$I_1 = I_0 \frac{\exp(V_C/V_T)}{1 + \exp(V_C/V_T)} \quad (6)$$

$$I_2 = I_0 \frac{1}{1 + \exp(V_C/V_T)} \quad (7)$$

where $I_0$ is the common emitter current when a control voltage $V_C$ is applied to the bases of the transistors, and $V_T$ is a thermal voltage given as $V_T = kT/q$.

Setting $\exp(V_C/V_T) = A$ in the equations (6) and (7), $$I_1 = I_0 \cdot A/1 + A = I_0 \cdot K \quad (8)$$

$$I_2 = I_0/1 + A = I_0 \cdot (1 - K) \quad (9)$$

It will be seen that the characteristics required by the dividing circuits 45 and 46 can be met.

Figure 3A:
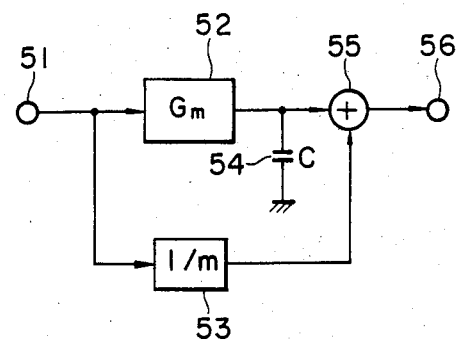
FIGS. 3(a) and 3(b) are schematic representations of embodiments of the modified integrator.

FIG. 3(a) shows an embodiment of the modified integrator 44. In this Figure, reference numeral 51 designates an input terminal, numeral 52 a voltage-current converting circuit with a conversion coefficient $G_m$, numeral 53 a coefficient unit with a coefficient ratio of 1/m, numeral 54 an integrating capacitor, numeral 55 an adder, and numeral 56 an output terminal.

In this embodiment, a modified integrating circuit with zero is constituted such that a signal passing through the coefficient unit 53 is fed to an integrating circuit constituted by the voltage-current converting circuit 52 and the integrating capacitor 54.

The transfer function T(s) is given as $$T(s) = \frac{m \cdot G_m/C + S}{m \cdot S} \quad (10)$$

Figure 3B:
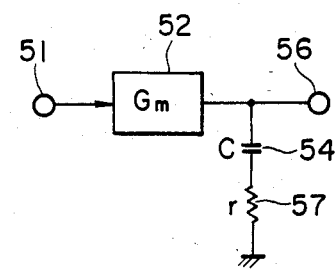

FIG. 3(b) is a block diagram showing a different embodiment of the modified integrator 44. In this instance, a resistor 57 is provided in series of the integrating capacitor 54 to replace the coefficient unit 53 in the embodiment of FIG. 3(a).

In this embodiment, the transfer function T(s) is $$T(s) = G_m \left( r + \frac{1}{SC} \right) \quad (11)$$

By selecting $G_m \cdot r = 1/m$, the equations (10) and (11) become equal, that is, the transfer functions become identical.

In this embodiment, it is desirable to provide the integrating capacitor 54 and resistor 57 as external components at the time of the IC implementation. Doing so has a merit that the construction in the integrated circuit is simplified although the external components are increased in number compared to the case of FIG. 3(a).

Figure 8:
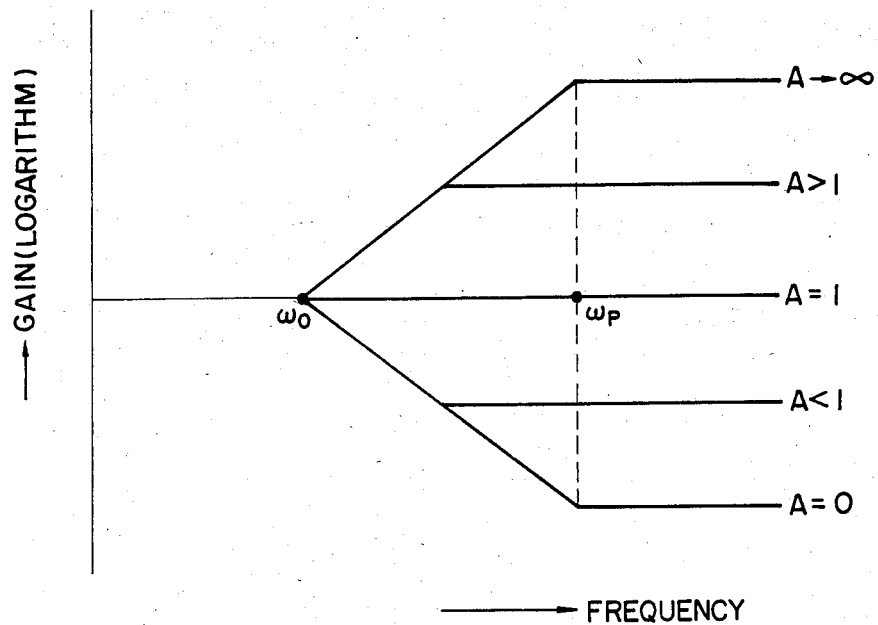
FIG. 8 is a view showing variable emphasis characteristics.
Figure 9:
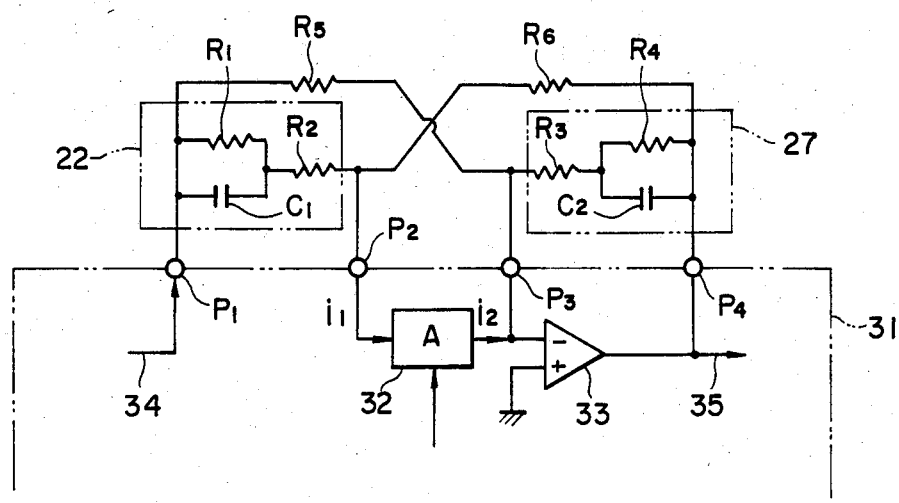
FIG. 9 is a circuit diagram showing a prior art variable emphasis circuit IC implementation.

It is to be understood that with the variable emphasis circuit according to the present invention transfer characteristics identical with the transfer characteristics as shown in FIG. 8 between $A=0$ and $A=\infty$ as in the prior art variable emphasis circuit can be obtained by varying the distribution coefficient K between 0 and 1.

In this case, the high frequency range attenuation and high frequency range emphasis like those in the prior art circuit have symmetricity with the distribution coefficients K and K−1 (instead of A and 1/A in the prior art case).

Figure 4:
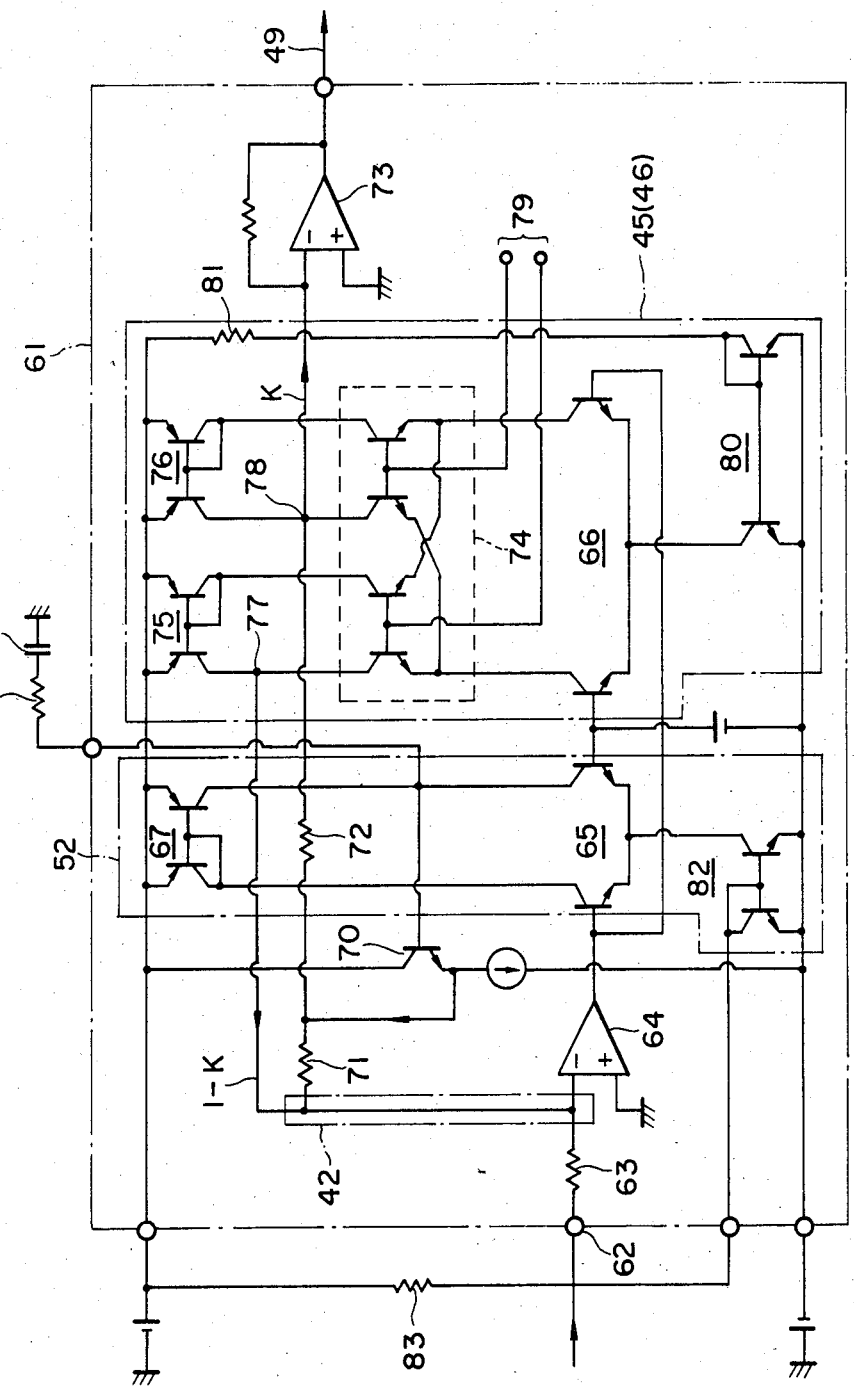
FIG. 4 is a circuit diagram showing an embodiment of the integrated circuit of the variable emphasis circuit according to the present invention.
Figure 5:
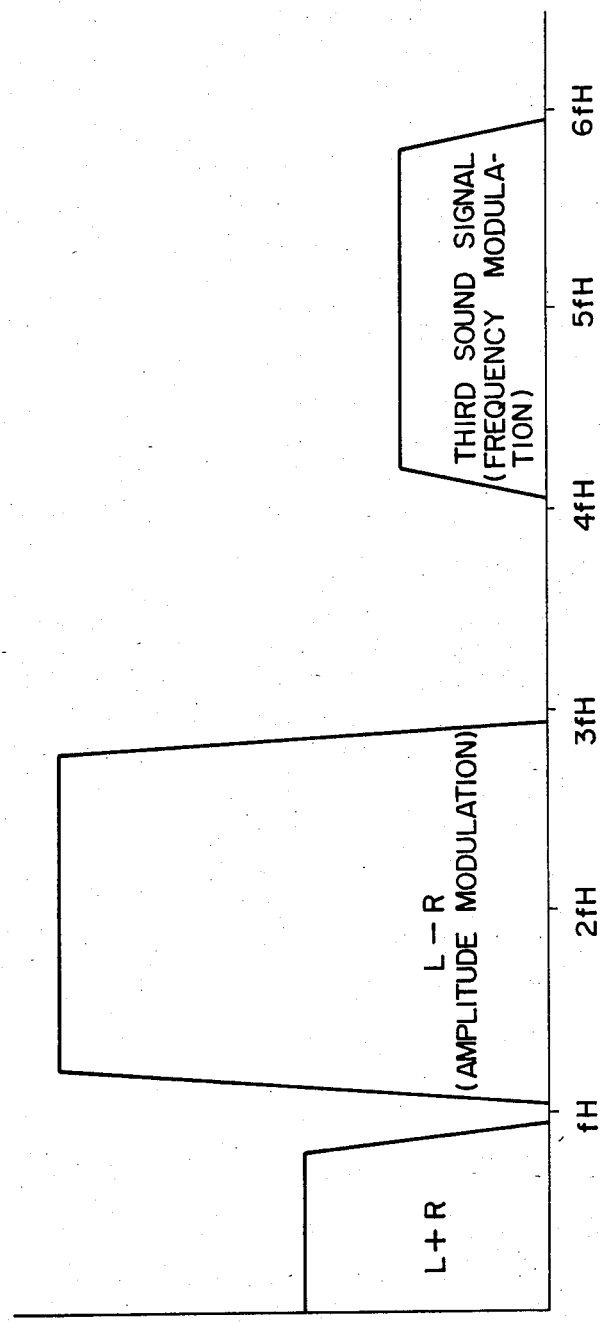
FIG. 5 is a graph showing a frequency spectrum of a multiplex sound signal.
Figure 6:
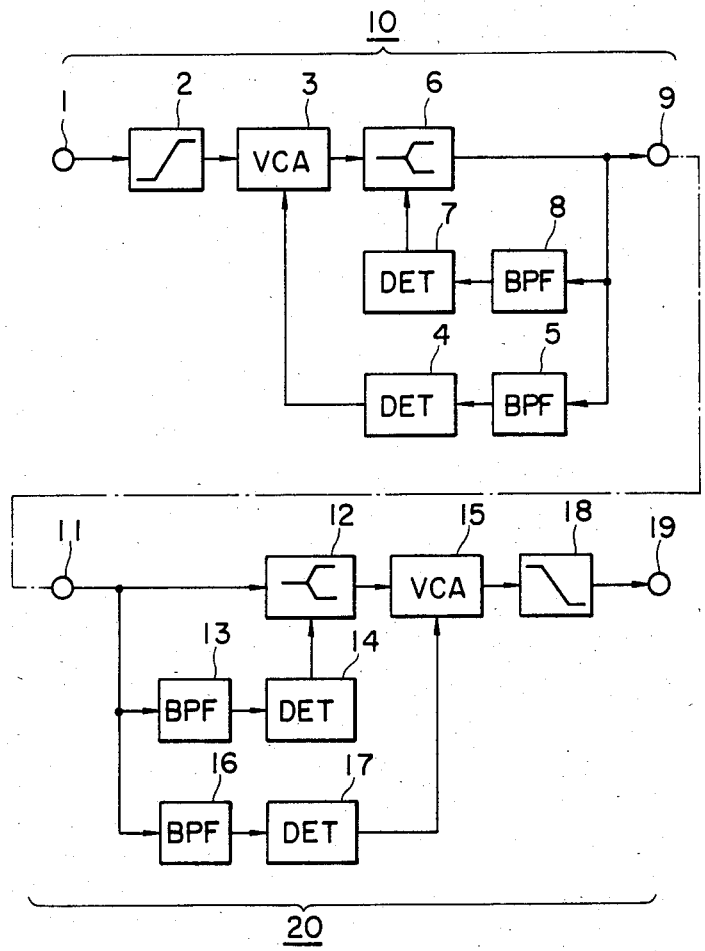
FIG. 6 is a block diagram showing a noise reduction apparatus.

FIG. 4 shows a specific example of the variable emphasis circuit according to the present invention. In the Figure, a portion shown enclosed in a phantom line rectangle 61 is an integrated circuit.

Reference numeral 62 designates an input terminal. An input signal is connected after current conversion through a resistor 63 to an inverted input terminal of an operational amplifier 64. The output of the operational amplifier 64 drives a differential amplifier 65 constituting the voltage-current converting circuit (52) and a differential amplifier 66 constituting the dividing circuits (45 and 46). The differential amplifier 65 constitutes the modified integrator (44) together with a current mirror circuit 67, a resistor 68 and a capacitor 69. The output of the differential amplifier is taken out from an emitter follower 70 to be current converted through a resistor 71 for being fed back to an inverted input terminal of the operational amplifier 64. The output is also current converted through a resistor 72 to be fed to an inverted input terminal of another differential amplifier 73.

The operational amplifier 73 constitutes the output side adder (48) to convert the sum of currents into a voltage.

The output of the differential amplifier 66 is fed to two current dividing circuits shown enclosed in a dashed line rectangle 74. These current dividing circuits are provided with respective current mirror circuits 75 and 76 for taking out only the AC component. An output current of the distribution ratio corresponding to $1-K$ is obtained at a node 77 of the circuit and fed to the inverted input terminal of the operational amplifier 64. Another output current of the distribution ratio corresponding to K is obtained at another node 78 and fed to the inverted input terminal of the operational amplifier 73. Reference numeral 79 designates an input terminal, to which a control voltage is applied.

The control voltage fed to the input terminal 79 is proportional to the logarithm of the amplitude of the signal obtained from the effective value detector 7 (14) noted before.

A bias current to the differential amplifier 66 is supplied through a current mirror circuit 80 and a resistor 81.

Meanwhile, a bias current to the differential amplifier 65 is supplied through a current mirror circuit 82 and a resistor 83. Thus, the ratio between the transfer conductances of the differential amplifiers 65 and 66 is set on the basis of the ratio between the resistances of the resistors 81 and 83.

The resistors 71, 72 and 81 formed in the integrated circuit are scattered resistors. Therefore, their absolute values fluctuate greatly, and also they have temperature dependency. The ratio between the resistances is substantially held constant. In this embodiment, however, the ratio between the external high accuracy resistor (83) and internal resistor 81 in the IC is accurately reflected on the transfer conductance ratio to compensate for the influence of fluctuations of the resistances of the resistors 71 and 72.

That is, so long as the ratio of the resistances of the resistors 71 and 72 and the resistance of the resistor 81 is held constant, the values of these resistances and the temperature dependency thereof will not influence the circuit characteristics.

The characteristics of the variable emphasis circuit according to the present invention are such that the opposite transfer function is provided when K of the dividing circuit 46 is $1-k$.

Thus, the compression system 10 can be utilized as the expansion system 20 and vice verse by interchanging K and $1-K$, that is, by inverting the polarity of the input to the input terminal 79.

As has been described in the foregoing, with the variable emphasis circuit according to the present invention it is possible to realize a characteristic that the high frequency range attenuation and high frequency range emphasis are changed continuously to each other according to the control voltage. In addition, while the feature that the high frequency range attenuation and high frequency range emphasis have symmetricity with K and $1-K$, the connection pins for connection to external parts or components can be reduced in the IC implementation, and hence the external parts or components to be connected, can be reduced in number.

Furthermore, even with reduction of the number of external elements stable circuit characteristics can be ensured, and high accuracy systems can be readily obtained.

What is claimed is:

1. A variable emphasis circuit receiving an input signal and having a variable frequency characteristic controlled by a control signal supplied thereto, said variable emphasis circuit comprising:
   an operational amplifier having at least an inverting input and an output producing an output signal;
   integrating circuit means supplied with the output signal of said operational amplifier for producing an output signal and having a transfer function of $T(S)=(\omega_O+S)/(m \cdot S)$, where $\omega_O$ is a zero angular frequency, m is a coefficient of said transfer function and S is a transform variable;
   dividing circuit means supplied with the output signal of said operational amplifier for dividing the same into first and second divided output signals, said control signal being supplied to said dividing circuit means for controlling a dividing ratio thereof;
   first adder means for adding said input signal, the output signal of said integrating circuit means and said first divided output signal of said dividing circuit means, and producing an output signal supplied to the inverting input of said operational amplifier; and
   second adder means for adding the output signal of said integrating circuit means and said second divided output signal of said dividing circuit means, and having an output for generating an output signal of said variable emphasis circuit.

2. A variable emphasis circuit according to claim 1, wherein said integrating circuit means includes voltage-current converting circuit means connected to the output of said operational amplifier, an integrating capacitor connected to the output of said voltage-current converting circuit means and producing an output signal, multiplier means for multiplying a coefficient 1/m by the output signal of said operational amplifier and producing an output signal and adding circuit means for adding the output signals of said integrating capacitor and the multiplier means.

3. A variable emphasis circuit according to claim 1, wherein said integrating circuit means includes voltage-current converting circuit means having an output and connected to the output of said operational amplifier and a series circuit of an integrating capacitor and a resistor connected to the output of said voltage-current converting circuit means.

4. A variable emphasis circuit according to claim 3, wherein said voltage-current converting circuit means includes differential amplifier means and current mirror circuit means connected as a load circuit of said differential amplifier means, an output of said current mirror circuit being connected to said series circuit.

5. A variable emphasis circuit according to claim 1, wherein said dividing circuit means includes first and second transistors whose emitters are connected together at a first connection point, the output signal of said operational amplifier being supplied to said first connection point, said control signal being supplied to bases of said first and second transistors and the first and second divided output signals being generated at collectors of said first and second transistors, respectively.

6. A variable emphasis circuit according to claim 5, wherein said dividing circuit means further includes input differential amplifier means supplied with the output of said operational amplifier, third and fourth transistors whose emitters are connected together at a second connection point, said first and second current mirror circuit means, complementary outputs of said input differential amplifier means being connected to said first and second connection points, respectively, said first current mirror circuit means being connected between collectors of said first and third transistors, and said second current mirror circuit means being connected between collectors of said second and fourth transistors.

* * * * *